US008769457B2

(12) United States Patent
Alpert et al.

(10) Patent No.: US 8,769,457 B2
(45) Date of Patent: Jul. 1, 2014

(54) SEPARATE REFINEMENT OF LOCAL WIRELENGTH AND LOCAL MODULE DENSITY IN INTERMEDIATE PLACEMENT OF AN INTEGRATED CIRCUIT DESIGN

(75) Inventors: Charles J. Alpert, Austin, TX (US); Myung-Chul Kim, Austin, TX (US); Gi-Joon Nam, Austin, TX (US); Shyam Ramji, Lagrangeville, NY (US); Natarajan Viswanathan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 13/539,440

(22) Filed: Jun. 30, 2012

(65) Prior Publication Data
US 2014/0007036 A1    Jan. 2, 2014

(51) Int. Cl.
*G06F 17/50*        (2006.01)
(52) U.S. Cl.
USPC ........... 716/110; 716/111; 716/119; 716/122; 716/123
(58) Field of Classification Search
CPC ............ G06F 17/5045; G06F 17/5068; G06F 17/5072; G06F 17/5077
USPC .......................... 716/110–111, 119, 122–123
See application file for complete search history.

(56) References Cited

U.S. PATENT DOCUMENTS

| 4,754,408 | A | 6/1988 | Carpenter et al. |
| 6,067,409 | A | 5/2000 | Scepanovic et al. |
| 6,097,886 | A | 8/2000 | Dave et al. |
| 6,249,902 | B1 * | 6/2001 | Igusa et al. ................... 716/123 |
| 6,493,658 | B1 | 12/2002 | Koford et al. |
| 6,662,348 | B1 | 12/2003 | Naylor et al. |
| 7,266,796 | B1 | 9/2007 | Chu et al. |
| 7,562,324 | B2 | 7/2009 | Chang et al. |
| 8,595,675 | B1 | 11/2013 | Alpert et al. |
| 2007/0150846 | A1 * | 6/2007 | Furnish et al. .................... 716/8 |
| 2009/0070718 | A1 | 3/2009 | Voldman |
| 2011/0239177 | A1 | 9/2011 | Chong et al. |

OTHER PUBLICATIONS

Webb, C.F. et al., "A 400-MHz S/390 microprocessor", IEEE Journal of Solid-State Circuits, vol. 32, Issue: 11, pp. 1665-1675, Nov. 1997 (Date of Current Version: Aug. 6, 2002).
International Business Machines Corporation, "A Method for Hierarchical Minimum-Perturbation VSLI Layout Optimization with Integer Constraints That Modifies Transform Locations and Contents", Jun. 3, 2005.
Demaris, D. et al, "Placement Optimization Using a Graphical Placement Tool in the VLSI Interactive Design Automation System Database", IBM TDB, Aug. 1, 1995.
Widmayer, P. et al., "Optimizing Pin Alignment in VLSI Circuit Layout", Jun. 29, 2984.

(Continued)

*Primary Examiner* — Paul Dinh
(74) *Attorney, Agent, or Firm* — Yudell Isidore Ng Russell PLLC

(57) ABSTRACT

After a global placement phase of physical design of an integrated circuit, a data processing system iteratively refines local placement of a plurality of modules comprising the integrated circuit within a die area based on density of the plurality of modules and separately refines local wirelength for the plurality of modules in individual subareas among a plurality of subareas of the die area. The data processing system thereafter performs detailed placement of modules in the plurality of subareas.

18 Claims, 11 Drawing Sheets

(56) References Cited

OTHER PUBLICATIONS

Vorwerk, Kristofer et al., "Engineering Details of a Stable Force-Directed Placer", Proceedings of the IEEE/ACM International conference on Computer-aided design, 2004.

U.S. Appl. No. 13/539,428 entitled "Local Objective Optimization in Global Placement of an Integrated Circuit Design"; Non-final office action dated Feb. 1, 2013.

U.S. Appl. No. 13/539,428 entitled "Local Objective Optimization in Global Placement of an Integrated Circuit Design"; Notice of Allowance dated Jul. 15, 2013.

Bo Hu, Malgorzata Marek-Sadowska, "PAR: Fixed-Points Addition & Relaxation Based Placement" Department of Electrical and Computer Engineering, Univ. of California, Santa Barbara, CA 2002.

* cited by examiner

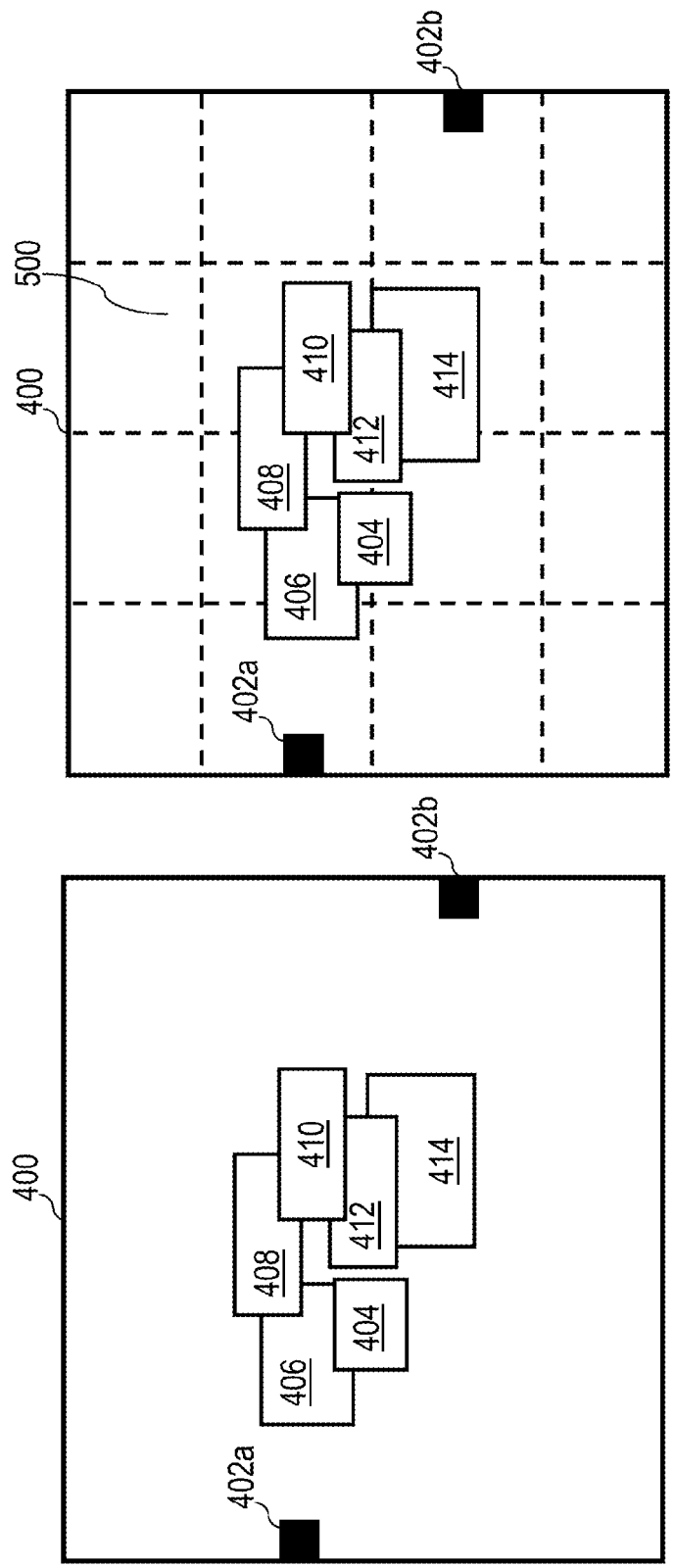

SEPARATE REFINEMENT OF LOCAL WIRELENGTH AND LOCAL MODULE DENSITY IN INTERMEDIATE PLACEMENT OF AN INTEGRATED CIRCUIT DESIGN

BACKGROUND OF THE INVENTION

The present invention relates to data processing, and more specifically, to physical design of an integrated circuit.

Physical design is the process of transforming a logical design of an integrated circuit, expressed, for example, in a register transfer level (RTL) or gate-level netlist description, into a physical realization of the integrated circuit. One of the first steps of physical design is global placement, which assigns modules in a netlist description to generally nonoverlapping locations within the fixed area allocated to an integrated circuit die. During global placement, a placement tool (or placer) is typically employed to generate an automatic placement of the modules with approximately regular module densities while optimizing some cost metric (typically wirelength).

Current placement algorithms include simulated annealing, min-cut, and analytical algorithms. Simulated annealing placement optimizes module placement by perturbing module positions based on simulated annealing. While good results can be obtained for small designs, simulated annealing placement lacks scalability and is therefore not applicable to large-scale circuit designs.

Min-cut placement recursively partitions the integrated circuit design and die area and assign sub-circuits of the integrated circuit design into sub-regions of the area. Min-cut placement is usually efficient and scalable and generally minimizes wirelength by minimizing the number of cuts between sub-circuits. However, by hierarchically partitioning the design and solving each partition independently, min-cut placers may reduce solution quality due to the omission of global information regarding the interaction among different circuit partitions. In addition, optimizing the cut value does not always directly translate to optimizing the wirelength of the design.

Analytical placement models placement as a mathematical programming problem composed of an objective function and a set of placement constraints. The analytical placement tool optimizes the objective function through analytical approaches, which generally achieve better placement quality for large-scale integrated circuit designs. Analytical placement commonly uses half-perimeter wirelength (HPWL) as the primary objective function because HPWL provides a good first order approximation of the routed wirelength that will eventually be achieved in the physical integrated circuit die.

BRIEF SUMMARY

In some embodiments, a global placement phase of physical design of an integrated circuit includes iteratively spreading a plurality of modules comprising the integrated circuit within a die area based on density of the plurality of modules and optimizing module placement by preserving global module density while improving a local objective, such as local wirelength and/or density, in individual subareas among a plurality of subareas of the die area.

In some embodiments, after the global placement phase of physical design of an integrated circuit, a data processing system iteratively refines local placement of a plurality of modules comprising the integrated circuit within a die area based on density of the plurality of modules and separately refines local wirelength for the plurality of modules in individual subareas among a plurality of subareas of the die area.

After global placement and, if implemented, intermediate placement, the data processing system thereafter performs detailed placement of modules in the plurality of subareas.

BRIEF DESCRIPTION OF THE SEVERAL VIEWS OF THE DRAWINGS

FIG. 4 depicts an exemplary die area showing the footprint and arrangement of a simplified integrated circuit design following the initial wirelength optimization;

FIG. 5 illustrates an exemplary die area subdivided into "bins" over which the average bin utilization (ABU) metric for density-based spreading can be computed;

DETAILED DESCRIPTION

Figure 1:
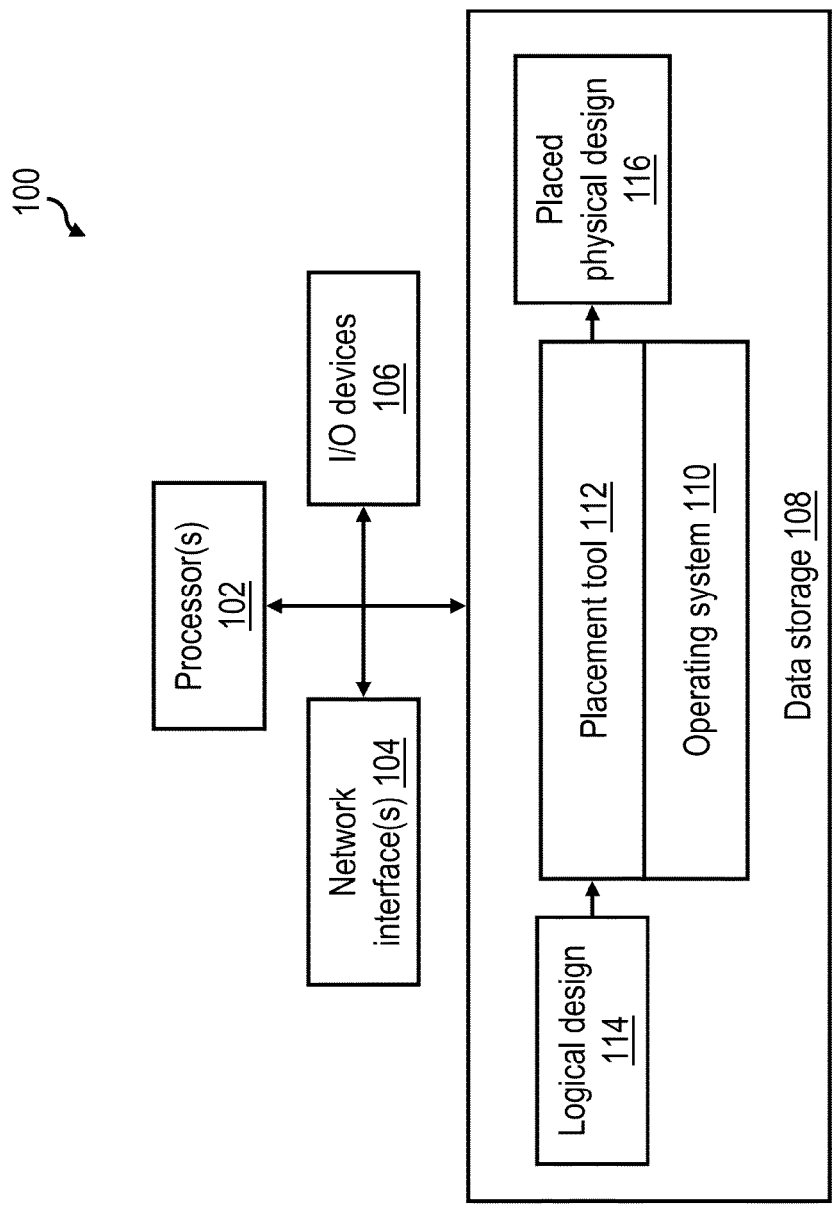
FIG. 1 is a high level block diagram of a data processing system in accordance with one embodiment.

With reference now to the figures and with particular reference to FIG. 1, there is illustrated a high level block diagram of an exemplary data processing system 100 in accordance with one embodiment. In the illustrated exemplary embodiment, data processing system 100 includes one or more processors 102 that process data and program code, for example, to produce a physical design for integrated circuit (IC) design. Data processing system 100 additionally includes one or more network interfaces 104 through which data processing system 100 can communicate with one or more other computing resources (e.g., other processing, storage or communication resources) via cabling and/or one or more wired and/or wireless, public and/or private, local and/or wide area networks (including the Internet). Data processing system 100 also includes input/output (I/O) devices 106, such as ports, display devices, and attached devices, etc., which receive inputs and provide outputs of the processing performed by data processing system 100 and/or other computing resource(s) coupled to data processing system 100. Finally, data processing system 100 includes data storage 108, which may include one or more volatile or non-volatile storage devices, including memories, solid state drives, optical or magnetic disk drives, tape drives, portable data storage media, etc.

In the illustrated embodiment, data storage 108 stores, in addition to operating system 110 (e.g., Windows®, Unix®, AIX®, Linux®, etc.), various program code and data processed by processor(s) 102 to produce a physical design of an integrated circuit. For example, the program code stored within data storage 108 includes a placement tool 112 that receives and processes a logical design 114, such as an RTL or netlist description of an integrated circuit, and generates therefrom a placed physical design 116 for the integrated circuit, as discussed further below.

Figure 2:
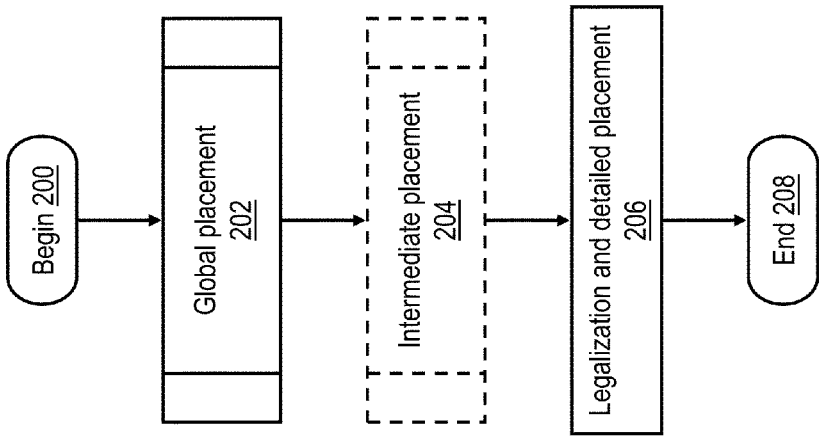
FIG. 2 is a high level logical flowchart of an exemplary process for placement of an integrated circuit design.

Referring now to FIG. 2, there is depicted a high level logical flowchart of an exemplary process of placement of an integrated circuit design. The illustrated process can be implemented, for example, by execution of placement tool 112 by processor(s) 102 of data processing system 100.

The process illustrated in FIG. 2 begins at block 200, for example, in response to invocation of operation of placement tool 112 on logical design 114. Placement tool 112 thereafter automatically places subcircuits of the integrated circuit design, also referred to as modules, within a predetermined area of an integrated circuit die. As illustrated, the automated placement of the modules within the die area is accomplished in a sequence of distinct phases, including an initial global placement (block 202), an optional intermediate placement (block 204), and finally, legalization and detailed placement (block 206).

As noted above, during global placement at block 202, placement tool 112 generates an automatic global placement of the modules comprising the integrated circuit design with approximately regular module densities while optimizing a predetermined cost metric (typically wirelength). At the conclusion of global placement, the modules within the integrated circuit design will be somewhat evenly distributed, but at least some of the modules will likely still have some overlap. If implemented, the intermediate placement illustrated at block 204 locally refines the global placement of the modules to improve (i.e., reduce) module density and additionally refines the local wirelength while preserving the overall module density achieved by global placement at block 202. Legalization and detailed placement (block 206) resolves any remaining overlap among modules within the integrated circuit design and locally improves wirelength. The placed physical design 116 obtained after legalization and detailed placement at block 206 can be expressed in any suitable format for expressing the physical structure of an IC design, such as one or more GDSII (GDS2), GL1 or OASIS files.

Following legalization and detailed placement at block 206, the placement process depicted in FIG. 2 ends at block 208. Thereafter, additional physical design steps such as clock insertion, wire routing, final performance and manufacturing optimizations and error checking are performed, and the physical design of the integrated circuit is then completed at tapeout with the generation of the photomasks utilized to realize the integrated circuit in a chosen semiconductor technology.

Figure 3:
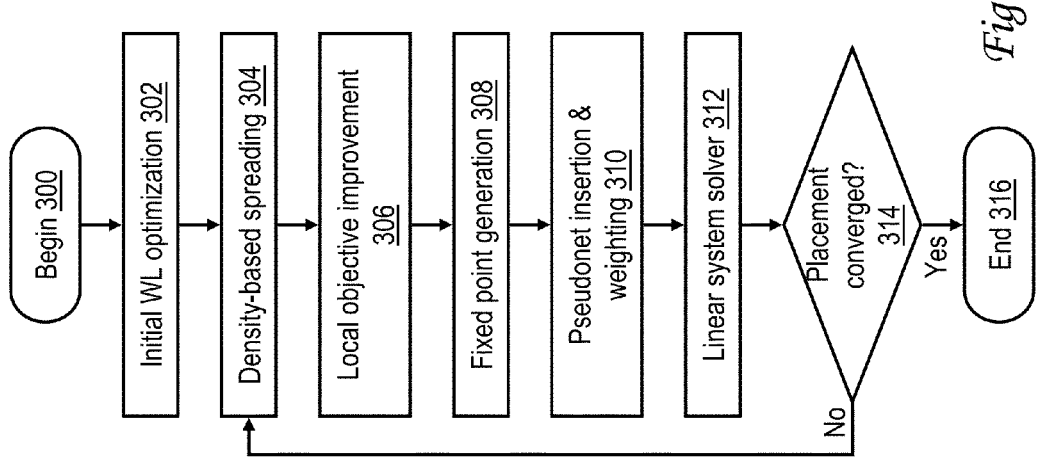
FIG. 3 is a high level logical flowchart of an exemplary process for global placement of an integrated circuit design.

With reference to FIG. 3, there is illustrated a high level logical flowchart of an exemplary process for global placement of an integrated circuit design, which can performed, for example, by placement tool 112 during global placement at block 202 of FIG. 2. The illustrated process employs an analytical placement methodology that has as its objective the optimization of wirelength. As a logical flowchart, it should be appreciated that in at least some embodiments, some of the illustrated steps can be performed in a different order than illustrated and/or concurrently.

The process begins at block 300, for example, in response to invocation of execution of placement tool 112 to automatically place the modules of the integrated circuit design specified by logical design 114 within a predetermined die area. Placement tool 112 first performs an initial wirelength optimization at block 302 based on the interconnections between modules specified by logical design 114. At block 302 and throughout the remainder of the global placement process shown in FIG. 3, placement tool 112 preferably employs half-perimeter wirelength (HPWL) as a proxy for the routed wirelength that will ultimately be obtained during wire routing and further optimizes computation of HPWL, a linear quantity, by utilizing a quadratic approximation or other smooth, differentiable approximation like the log-sum-exponential wire length model disclosed in U.S. Pat. No. 6,301, 693, which is incorporated herein by reference.

Referring briefly to FIG. 4, an exemplary die area 400 is illustrated that represents the footprint and arrangement of a simplified integrated circuit design following the initial wirelength optimization at block 302. Die area 400 includes two input/output (I/O) pads 402a and 402b and a collection of modules 404-414 comprising the integrated circuit design. As shown, the initial wirelength optimization typically results in the modules 404-414 comprising the integrated circuit design being tightly bunched in the central region of die area 400.

Returning to FIG. 3, after the initial wirelength optimization performed at block 302, placement tool 112 enters an iterative processing loop comprising block 304 to block 314 in which placement tool 112 spreads the modules comprising the integrated circuit design (e.g., modules 404-414) in accordance with a selected methodology. In contrast to conventional global placement techniques, placement tool 112 explicitly applies local wirelength improvement during the iterative spreading without disrupting intermediate placement in order to achieve better wirelength with comparable distribution of modules.

Referring now to block 304, placement tool 112 spreads the modules within the die area in order to achieve a target value of a selected density metric. In a preferred embodiment illustrated in FIG. 5, placement tool 112 subdivides die area 400 into "bins" 500 (which can conveniently be of approximately equal area) and uses as the density metric the average bin utilization (ABU) of a selected percentage (e.g., 5% or 10%) of the densest bins (excluding bins fully occupied by fixed modules whose locations were predetermined a priori), where the density of an individual bin 500 is computed as the area of the module(s) 404-414 falling within a given bin 500 divided by the area of that bin 500. As will be appreciated, the target value of the selected density metric can vary between iterations, for example, along a linear or exponential curve converging from an initial target value (e.g., 2.0) toward a final target value (e.g., 0.7 or 0.5). After the placement tool 112 applies density-based spreading at block 304, modules 404-414 will be incrementally distributed within die area 400 as shown in FIG. 6.

Returning to FIG. 3, at block 306 placement tool 112 improves a selected local objective while substantially preserving the present global density of the modules comprising the integrated circuit design (e.g., modules 404-414). In various embodiments, different local objectives can be pursued at block 306. For example, the local objective can be wirelength (e.g., the linear HPWL wirelength determined for individual bins 500) or a combination of local wirelength and other local factors, such as local module density, local pin density, etc. To substantially preserve the global density wile the local objective is pursued, in some embodiments the application of local objective can be bounded by a constraint that the density of an individual bin cannot be increased by more than a predetermined small percentage. In other embodiments, the density constraint during local objective improvement is met by joint optimization of density and the local objective (i.e., concurrent performance blocks 304-306) by movement of individual modules based on a linear combination of improvements in the local objective and module density.

Figures 6, 7:
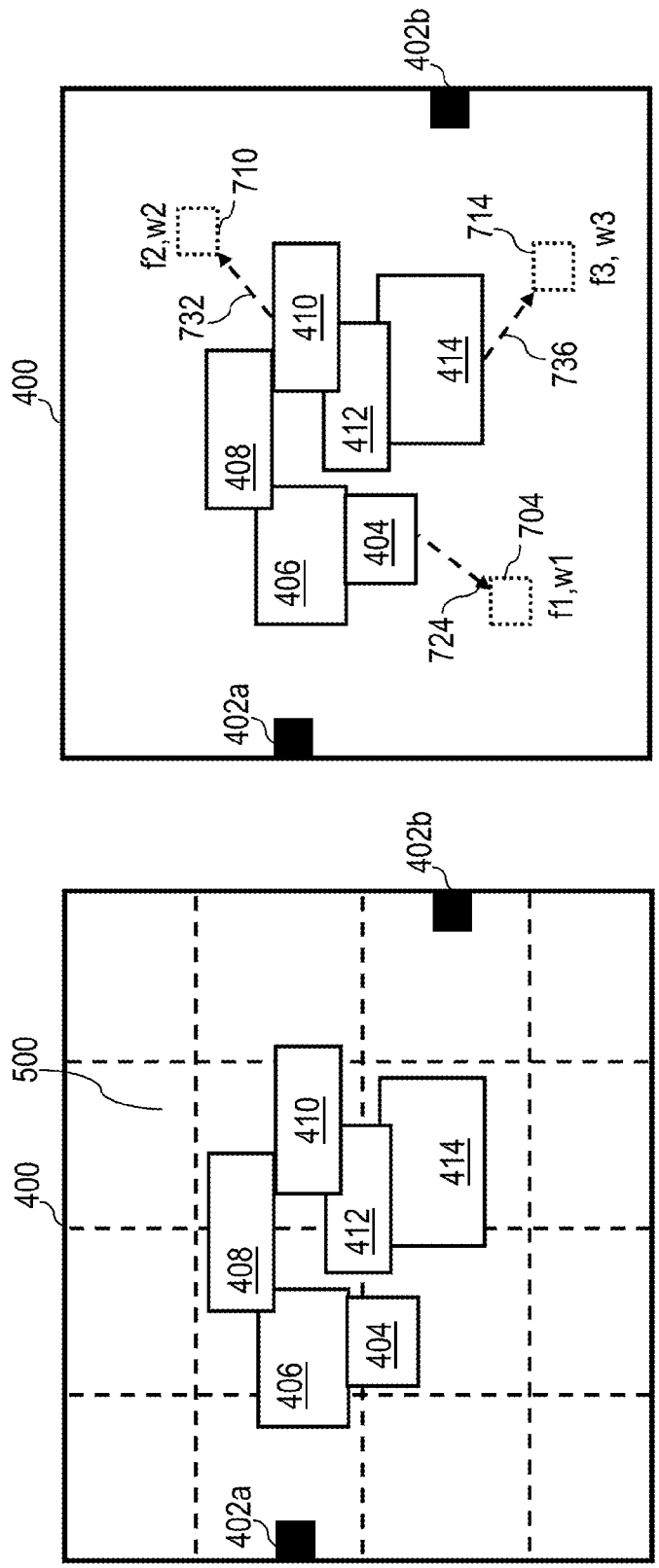
FIG. 6 depicts an exemplary die area and the incremental spreading of modules over the "bins" into which the exemplary die area is subdivided.
FIG. 7 illustrates an exemplary die area and the application of spreading forces by way of fixed-points and pseudo-nets during force-directed global placement (FDP) to further optimize wirelength and module density.

At blocks 308-312, placement tool 112 utilizes force-directed placement (FDP) to further optimize wirelength and module density, as additionally illustrated in FIG. 7. Specifically, at block 308 placement tool 112 generates fixed points for each module in the design, where each fixed point represents a prediction of a new location for an associated one of the modules comprising the integrated circuit design imposed on the wirelength-optimized solution. For example, FIG. 7 depicts placement tool 112 generating fixed points 704, 710 and 714 for modules 404, 410 and 414, respectively. (Fixed points for modules 406, 408 and 412 are not illustrated to avoid overcrowding the figure.) At block 310, placement tool 112 next inserts pseudonets into the design, where each pseudonet links a fixed point generated at block 308 with the associated module (from the set of modules 404-414) and where each pseudonet has an associated force and weight. For example, FIG. 7 illustrates placement tool 112 temporarily inserting into the integrated circuit design pseudonets 724, 732 and 736 respectively linking module 404 and fixed point 704, module 410 and fixed point 710, and module 414 and fixed point 714. As shown, placement tool 112 has further assigned pseudonets 724, 732 and 736 force vectors f1, f2 and f3 along pseudonets 724, 732 and 736 and assigned weights w1, w2 and w3 to pseudonets 724, 732 and 736, respectively. Utilizing the fixed points generated at block 308 and force vectors and weights assigned at block 310, placement tool 112 applies a linear system solver, resulting in a more spread configuration of the modules (block 312).

At block 314, placement tool 112 determines whether or not global placement has converged to a point of relative stasis, for example, by comparing some metric of module spreading (or density) to a minimum threshold. If placement tool 112 determines at block 314 that global placement has not converged, as is generally the case for thirty (30) iterations or more, the process returns to block 304, which has been described. If, on the other hand, placement tool 112 determines at block 314 that placement has converged, global placement terminates at block 316.

The process of FIG. 3 thus concurrently pursues the dual objectives of a local objective (e.g., local wirelength improvement and/or local density and/or local pin count) and density improvement during global placement through application of iterative local refinement, thus improving the local objective of the integrated circuit design while retaining a reasonable global density profile. The improved fixed-point locations obtained through local refinement, which are used to generate force-vectors for FDP, provide improved inputs into the linear system solver applied at block 312 and therefore achieves better solutions (placements). Consequently, the global placement performed at block 202 results in better local wirelengths, module densities and pin densities with a comparable global density profile.

Figure 8:
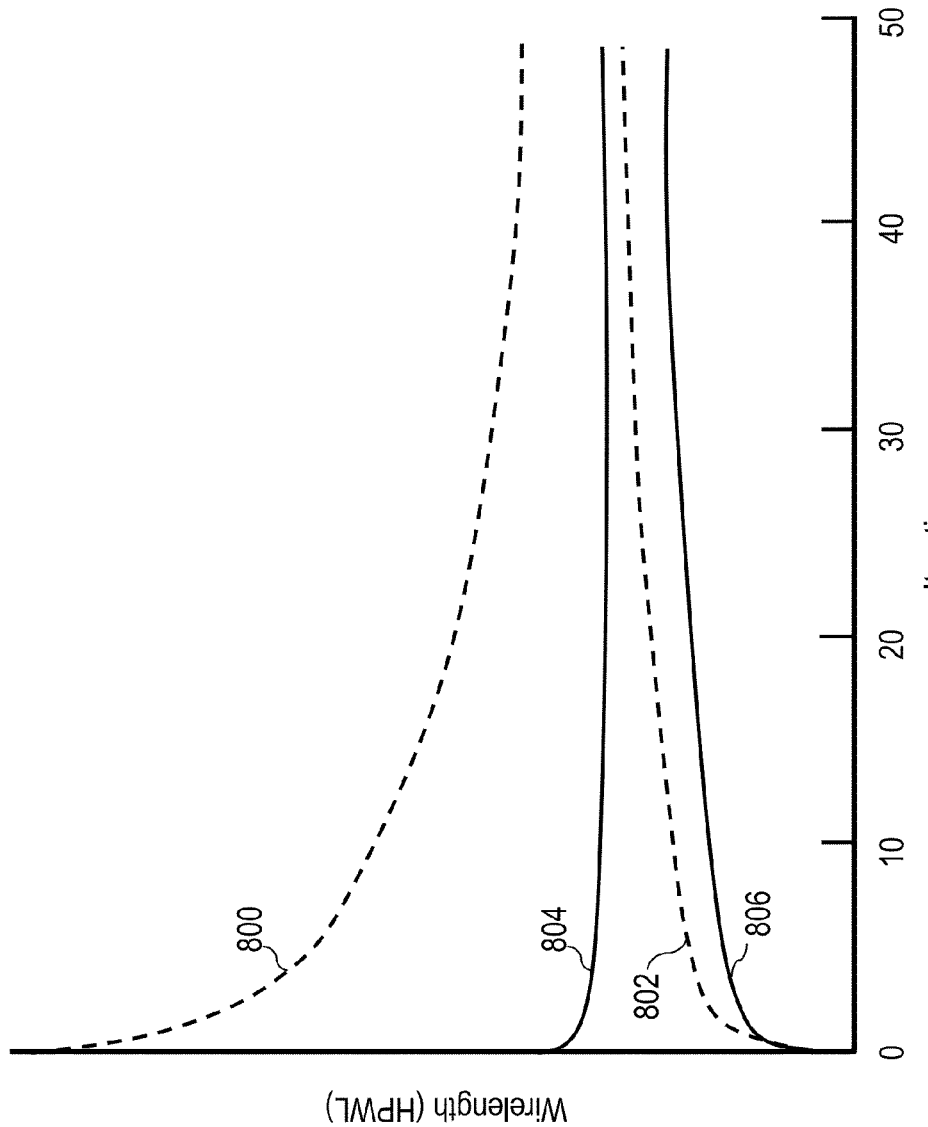
FIG. 8 is a graph of empirical results illustrating the effect on wirelength of the inclusion of local wirelength improvement in the global placement process of FIG. 3.

Referring now to FIG. 8, there is depicted a graph of empirical results illustrating the effect on HPWL of the inclusion of local wirelength improvement in the global placement process of FIG. 3 as applied to an exemplary large scale integrated circuit design. In the graph, curve 800 represents the wirelength (i.e., HPWL) of the fixed points generated at block 308 of FIG. 3 over the iterations of the global placement process if the local wirelength improvement at block 306 is omitted. Curve 802 similarly represents the HPWL of the placement solution generated by the application of the linear system solver at block 312 of FIG. 3 over the iterations of the global placement process if the local wirelength improvement at block 306 is omitted. Thus, if local wirelength improvement is omitted, the HPWL of the global placement of the design will oscillate between curves 800 and 802 and then finally converge to curve 802.

If local wirelength improvement is applied at block 306, the wirelength of the fixed points generated at block 308 is represented by curve 804, and the wirelength resulting from the application of the linear system solver at block 312 is represented by curve 806. At the conclusion of the global placement process of FIG. 3, the wirelength will converge on curve 806. FIG. 8 clearly illustrates that the improved fixed-point locations obtained through local wirelength refinement, which are used to generate force-vectors for FDP, provide improved inputs into the linear system solver applied at block 312 and therefore result in an improved wirelength.

Figure 9:
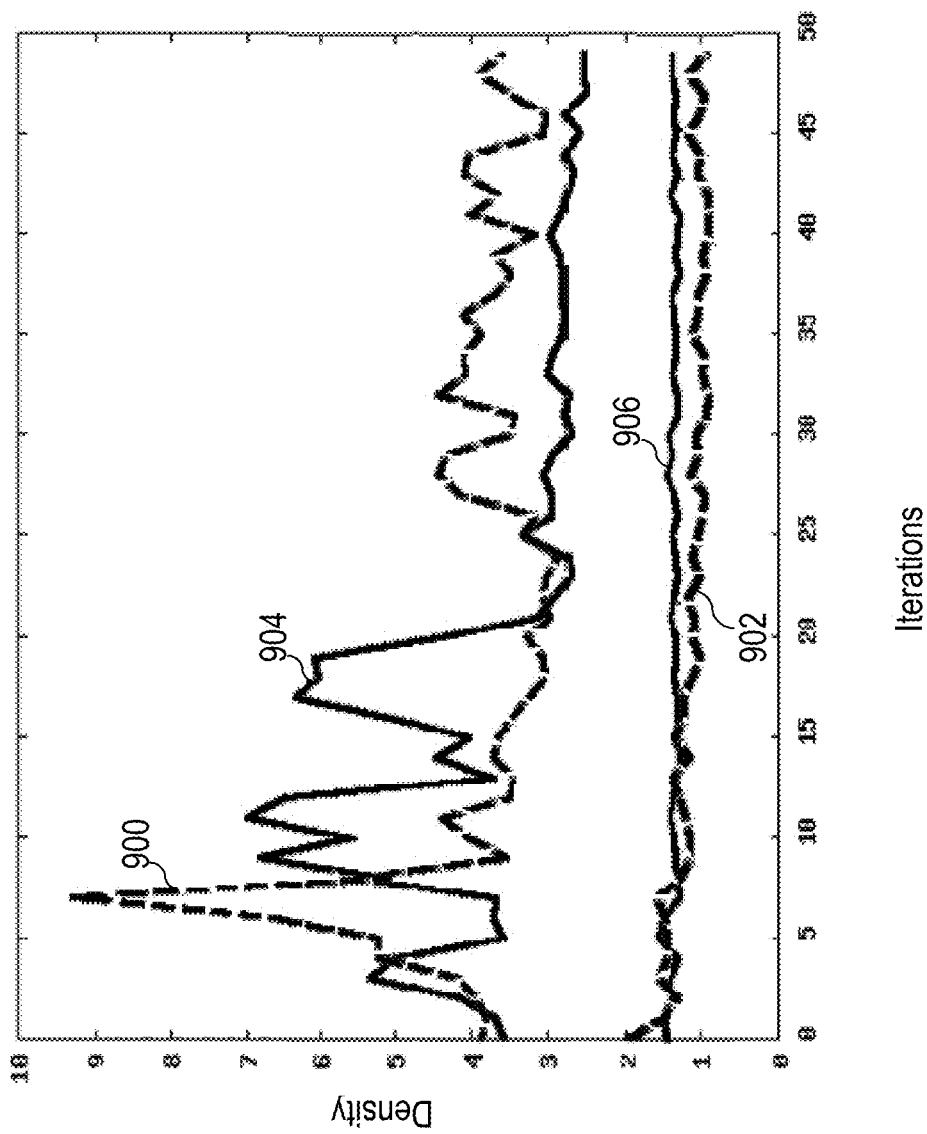
FIG. 9 is a graph of empirical results of the effect on module density of the inclusion of local wirelength improvement in the global placement process of FIG. 3.

With reference now to FIG. 9, there is illustrated a graph of empirical results of the effect on module density of the inclusion of local objective improvement in the global placement process of FIG. 3 as applied to an exemplary large scale integrated circuit design. In the graph, curve 900 represents the module density of the placement solution generated by the application of the linear system solver at block 312 of FIG. 3 over the iterations of the global placement process if the local objective improvement at block 306 is omitted. Curve 902 similarly represents the module density of the fixed points generated at block 308 of FIG. 3 if the local objective improvement at block 306 is omitted. Thus, if local objective improvement is omitted, the module density of the global placement of the design will oscillate between curves 900 and 902 and then finally converge to curve 900.

If local objective improvement is applied at block 306, the module density of the fixed points generated at block 308 is represented by curve 906, and the module density resulting from the application of the linear system solver at block 312 is represented by curve 904. At the conclusion of the global placement process of FIG. 3, the module density will converge on curve 904. FIG. 9 clearly illustrates by curve 904 having a lower final density than curve 900 that local objective optimization (e.g., optimization of local wirelength and/or local density and/or local pin density) actually results in better overall module density as compared to global placement omitting local objective optimization.

Figure 10:
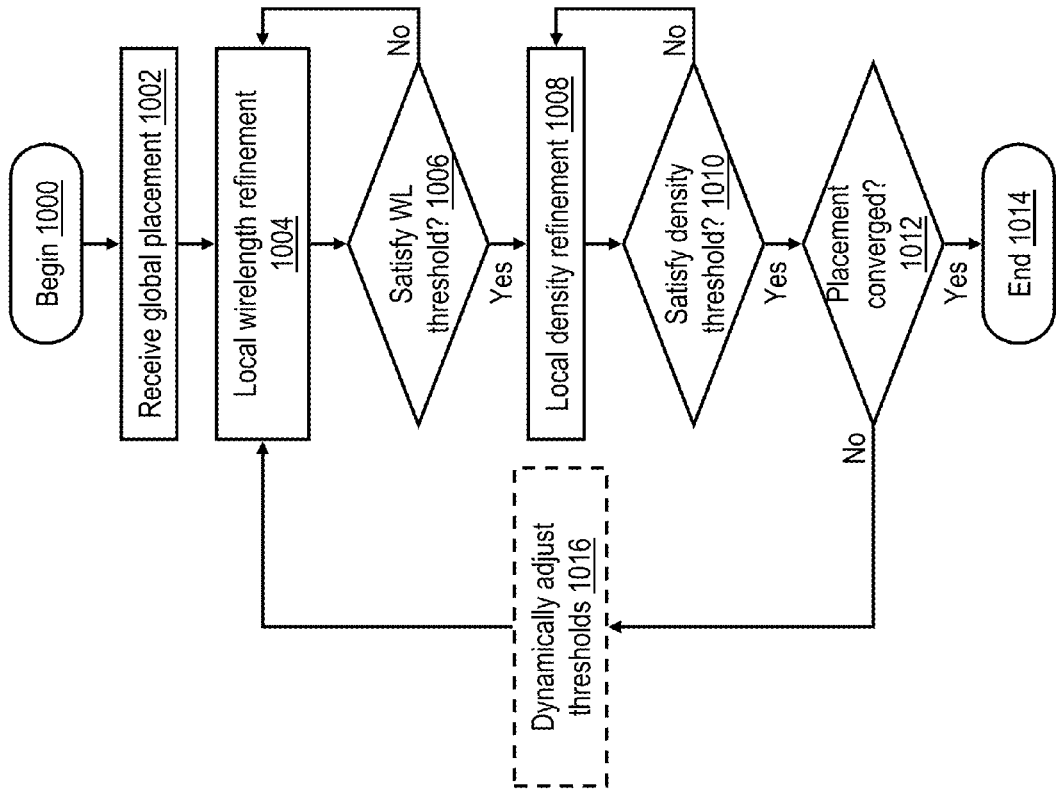
FIG. 10 a high level logical flowchart of an exemplary process for intermediate placement of an integrated circuit design.

Referring now to FIG. 10, there is depicted a high level logical flowchart of an exemplary process for intermediate placement of an integrated circuit design, which can performed, for example, by placement tool 112 during intermediate placement at block 204 of FIG. 2. As a logical flowchart, it should be appreciated that in at least some embodiments, some of the illustrated steps can be performed in a different order than illustrated and/or concurrently.

The process begins at block 1000 and then proceeds to block 1002, which illustrates placement tool 112 receiving as an input a global placement, for example, the global placement obtained at the conclusion of the global placement performed at block 202 of FIG. 2. Next, placement tool 112 proceeds to iteratively and separately pursue the twin objectives of local wirelength optimization and local module density optimization. In the depicted embodiment, placement tool 112 first implements local wirelength (e.g., HPWL) refinement at block 1004, and as indicated at block 1006, continues to iteratively do so until a wirelength threshold is satisfied. In local wirelength refinement, wirelength is improved in individual bins 500, and the wirelength threshold can be computed, for example, as an average wirelength across all of the bins 500 of die area 400. In response to placement tool 112 determining at block 1006 that the wirelength threshold is satisfied, placement tool 112 next implements local module density refinement at block 1008. As indicated at block 1010, placement tool 112 continues to iteratively refine local module density until a density threshold is satisfied. In module density refinement, placement tool 112 improves module density in individual bins 500, and the density threshold can be, for example, a selected value for the average density of a selected percentage (e.g., 5% or 10%) of the densest bins 500. It should be noted that in alternative embodiments, the iterative local density refinement depicted at blocks 1008 and 1010 can alternatively be performed prior to local wirelength refinement illustrated at blocks 1004 and 1006. Further, in some embodiments, the objective pursued during each of steps 1004 and 1008 can additionally include a threshold that constrains degradation of the other metric. For example, this additional threshold can constrain degradation of local density during local wirelength refinement, and can constrain degradation of local wirelength during local density refinement.

Following both iterative local wirelength refinement and iterative local density refinement, placement tool 112 determines at block 1012 whether or not placement has converged to a point of relative stasis, for example, by comparing some metric of module density and/or wirelength to a convergence threshold. If placement tool 112 determines at block 1012 that intermediate placement has converged, intermediate placement terminates at block 1014. If, on the other hand, placement tool 112 determines at block 1012 that intermediate placement has not converged, as is generally the case for multiple iterations of the processing loop including blocks 1004-1012, the process returns to block 1004, which has been described. In at least some embodiments, the wirelength and density thresholds applied at block 1006 and 1010 are dynamically adjusted between iterations of the processing loop including blocks 1004-1012, for example, according to a linear or exponential function (block 1016).

Figure 11:
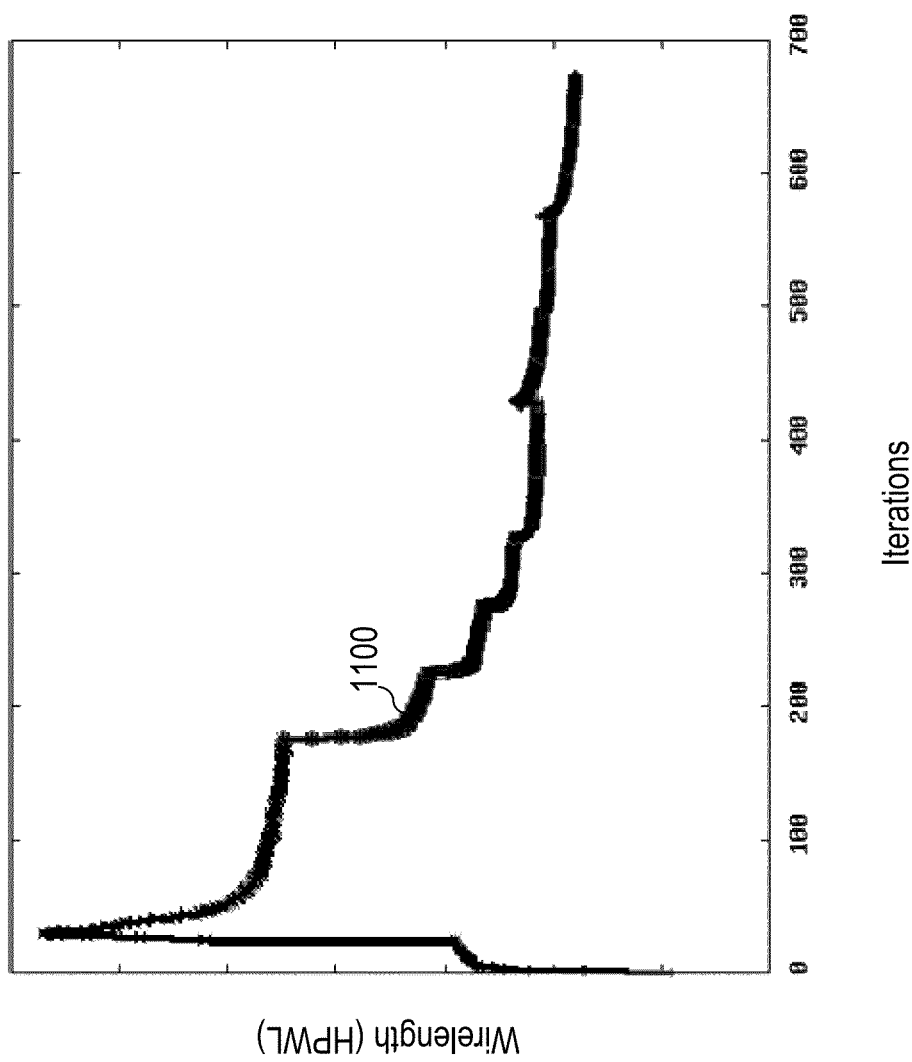
FIG. 11 is a graph of empirical results of wirelength versus iterations in a conventional intermediate placement process.
Figure 12:
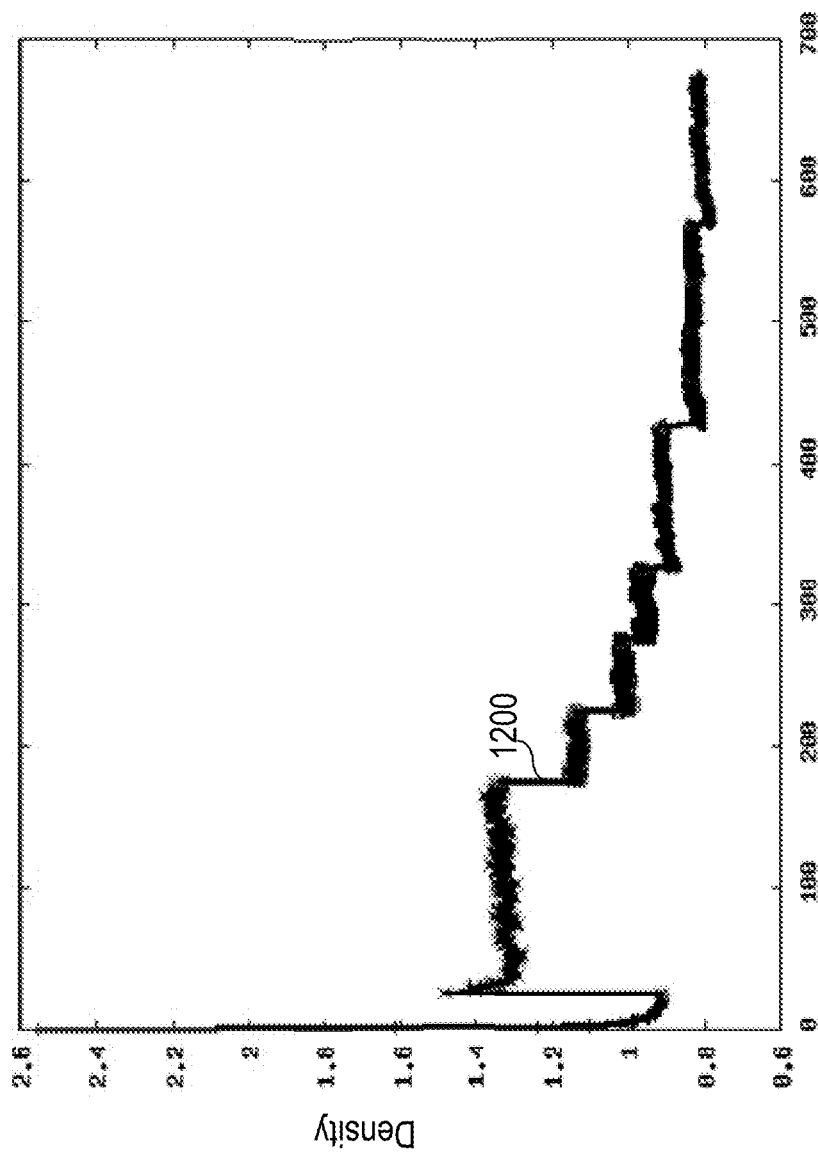
FIG. 12 is a graph of empirical results of module density versus iterations in a conventional intermediate placement process.

With reference now to FIGS. 11 and 12, there are respectively illustrated graphs of empirical results of wirelength and module density versus iterations in a conventional intermediate placement process in which wirelength and module density are simultaneously (as opposed to separately) optimized. In the conventional process, wirelength and module density are simultaneously optimized through a linear objective function of the form:

$$score = \alpha \cdot density + \beta \cdot wirelength$$

where $\alpha$ and $\beta$ are coefficients.

FIGS. 11-12 particularly illustrate that in the first twenty to thirty iterations, conventional intermediate placement radically changes the placement obtained through global placement. In the illustrated example, the wirelength indicated by curve 1100 of FIG. 11 sharply increases, and the module density indicated by curve 1200 of FIG. 12 precipitously decreases at the beginning of intermediate placement. Thus, much of the wirelength improvement obtained during global placement is immediately reversed. Depending on the coefficients employed in the linear objective function, the linear objective function can also become stuck in a local minima due to the natively greedy structure of the linear objective function and the lack of well defined balance between the dual objectives of wirelength and module density.

Figure 13:
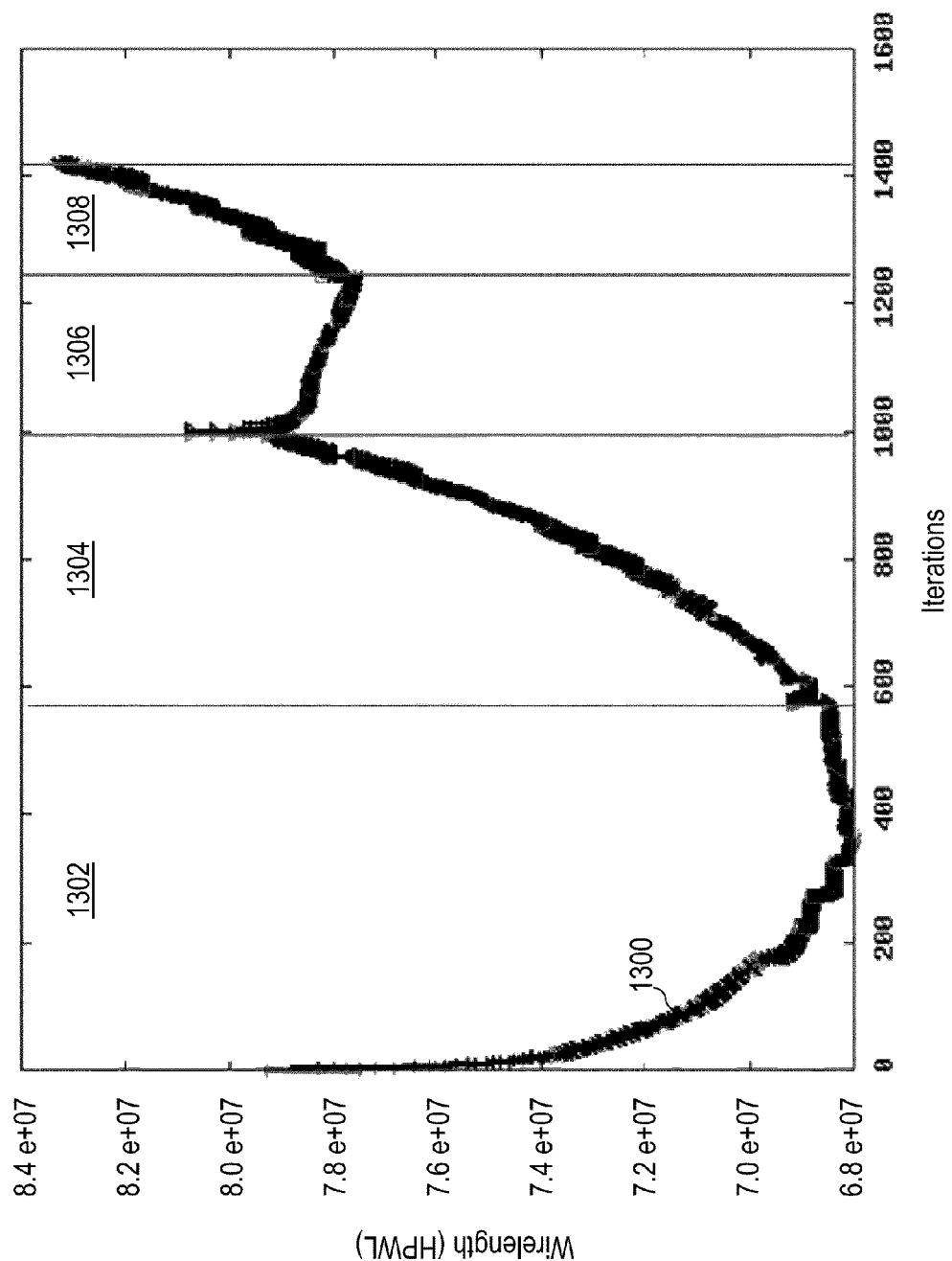
FIG. 13 is a graph of empirical results of wirelength versus iterations in the intermediate placement process of FIG. 10.
Figure 14:
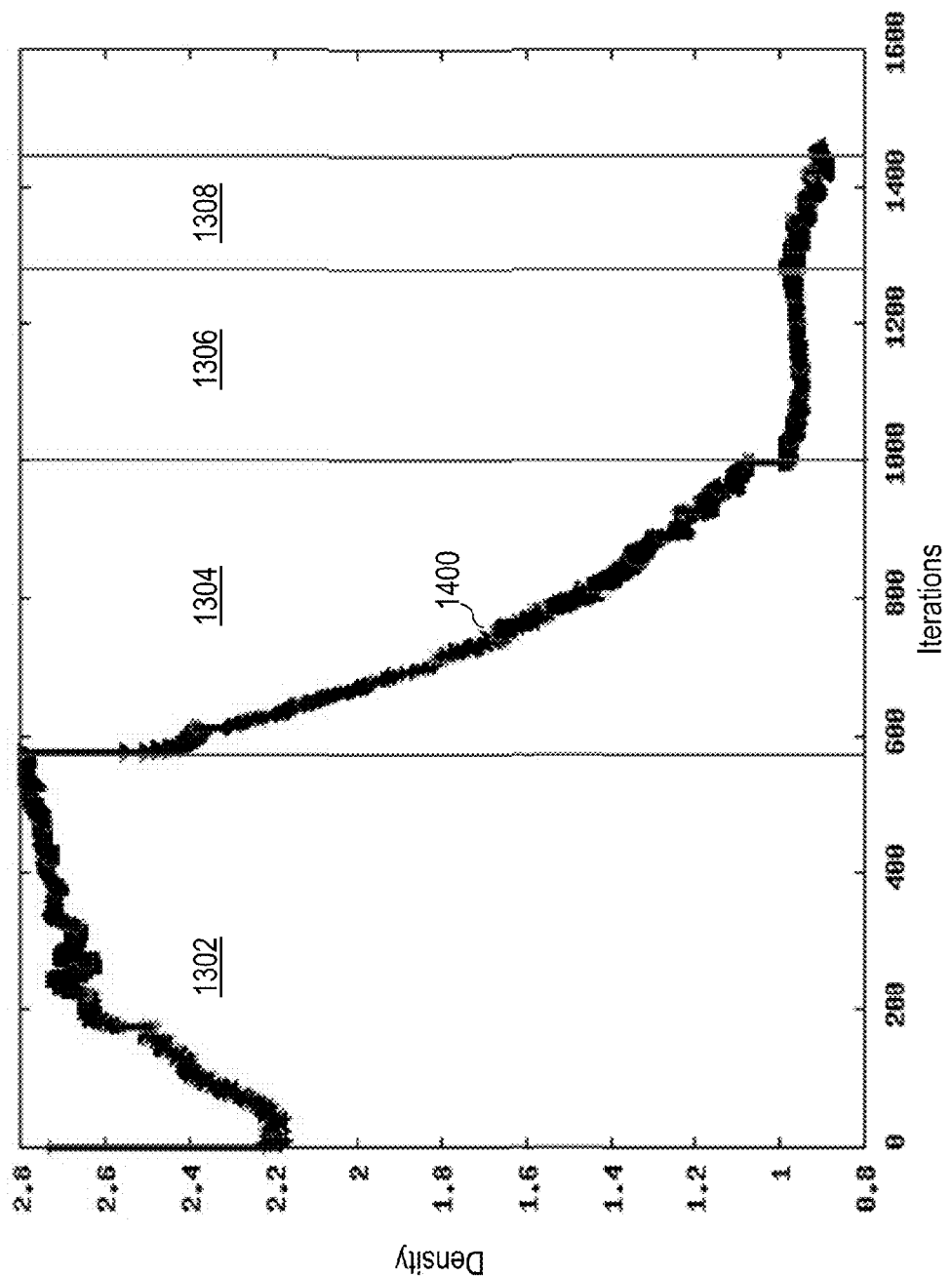
FIG. 14 is a graph of empirical results of module density versus iterations in the intermediate placement process of FIG. 10.

Referring now to FIG. 13-14, there are respectively depicted graphs of empirical results of wirelength and module density versus iterations for the exemplary intermediate placement process of FIG. 10. FIGS. 13-14 illustrate an exemplary processing scenario in which placement tool 112 performs the steps in the processing loop including blocks 1004-1012 twice, with the first iteration having distinct wirelength and density optimization phases 1302 and 1304, respectively, and the second iteration having distinct local wirelength and local density optimization phases 1306 and 1308, respectively.

As indicated by curves 1300 and 1400 of FIGS. 13 and 14, respectively, during local wirelength optimization phase 1302, which corresponds to blocks 1004-1006 of FIG. 10, local wirelength is steadily improved over more than 500 processing iterations without abruptly disturbing the module density achieved during global placement, which experiences an approximately 25% increase. Next, during density optimization phase 1304, local module density is steadily (and approximately linearly) improved over approximately 400 processing iterations corresponding to blocks 1008-1010, while local wirelength steadily (and approximately linearly) increases.

During the next iteration of the processing loop including blocks 1004-1012, placement tool 112 again optimizes local wirelength during local wirelength optimization phase 1306 without making any substantial modification to the module density over approximately 150 processing iterations. In addition, during local density optimization phase 1308, placement tool 112 again optimizes local module density over approximately 100 processing iterations while local wirelength steadily (and approximately linearly) increases. In summary, over the two iterations the processing loop including blocks 1004-1012, placement tool 112 decreases local module density by more the half, with only a modest increase in local wirelength of approximately 5%. Thus, by pursuing the objectives of decreased density and decreased wirelength independently in an interleaved manner, the overall results of intermediate placement are improved as compared to conventional intermediate placement techniques that pursue these objectives simultaneously.

As has been described, in some embodiments, a global placement phase of physical design of an integrated circuit includes iteratively spreading a plurality of modules comprising the integrated circuit within a die area based on density of the plurality of modules and optimizing module placement by preserving global module density while improving local wirelength in individual subareas among a plurality of subareas of the die area. After global placement, detailed placement of modules in the plurality of subareas is performed.

After a global placement phase of physical design of an integrated circuit, a data processing system iteratively refines local placement of a plurality of modules comprising the integrated circuit within a die area based on density of the plurality of modules and separately refines local wirelength for the plurality of modules in individual subareas among a plurality of subareas of the die area. The data processing system thereafter performs detailed placement of modules in the plurality of subareas.

While the present invention has been particularly shown as described with reference to one or more preferred embodiments, it will be understood by those skilled in the art that various changes in form and detail may be made therein without departing from the spirit and scope of the invention.

For example, although aspects have been described with respect to a computer system executing program code that directs the functions of the present invention, it should be understood that present invention may alternatively be implemented as a program product including a computer-readable storage device (e.g., volatile or non-volatile memory, optical or magnetic disk or other statutory manufacture) that stores program code that can be processed by a data processing system.

What is claimed is:

1. A method of data processing, comprising:
after a global placement phase of physical design of an integrated circuit, a computer processor iteratively performing intermediate placement by:
during each iteration of intermediate placement, iteratively refining local placement of a plurality of modules comprising the integrated circuit within a die area based on density of the plurality of modules until a module density threshold is satisfied;
during each iteration of intermediate placement, separately iteratively refining local wirelength for the plurality of modules in individual subareas among a plurality of subareas of the die area until a wirelength threshold is satisfied;
determining whether placement of the plurality of modules has converged;
in response to determining that placement of the plurality of modules has not converged, continuing the intermediate placement by performing said refining local placement and said refining local wirelength in another iteration of intermediate placement;
in response to determining that placement of the plurality of modules has converged, ending said iteratively performing intermediate placement; and
after performing intermediate placement, performing detailed placement of modules in the plurality of subareas to obtain a placed physical design.

2. The method of claim 1, wherein the data processing system, in each iteration of intermediate placement, performs refining local placement prior to separately refining local wirelength.

3. The method of claim 1, wherein the data processing system, in each iteration of intermediate placement, performs refining local placement after separately refining local wirelength.

4. The method of claim 1, wherein the density threshold comprises a predetermined value of an average density of a predetermined percentage of densest subareas of the die area.

5. The method of claim 4, and further comprising dynamically varying the density threshold between each of multiple iterations of refining local placement.

6. The method of claim 1, wherein determining whether placement of the plurality of modules has converged includes determining whether placement of the plurality of modules has converged to a point of relative stasis.

7. A data processing system, comprising:
a processor;
data storage coupled to the processor; and
program code stored within data storage, wherein the program code, when executed by the processor, causes the data processing to perform:
after a global placement phase of physical design of an integrated circuit, a data processing system iteratively performing intermediate placement by:
during each iteration of intermediate placement, iteratively refining local placement of a plurality of modules comprising the integrated circuit within a die area based on density of the plurality of modules until a module density threshold is satisfied;
during each iteration of intermediate placement, separately iteratively refining local wirelength for the plurality of modules in individual subareas among a plurality of subareas of the die area until a wirelength threshold is satisfied;
determining whether placement of the plurality of modules has converged;
in response to determining that placement of the plurality of modules has not converged, continuing the intermediate placement by performing said refining local placement and said refining local wirelength in another iteration of intermediate placement;
in response to determining that placement of the plurality of modules has converged, ending said iteratively performing intermediate placement; and
after performing intermediate placement, performing detailed placement of modules in the plurality of subareas to obtain a placed physical design.

8. The data processing system of claim 7, wherein the program code causes the data processing system, in each iteration of intermediate placement, to perform refining local placement prior to separately refining local wirelength.

9. The data processing system of claim 7, wherein the program code causes the data processing system, in each iteration of intermediate placement, to perform refining local placement after separately refining local wirelength.

10. The data processing system of claim 7, wherein the density threshold comprises a predetermined value of an average density of a predetermined percentage of densest subareas of the die area.

11. The data processing system of claim 10, wherein the program code further causes the data processing system to perform dynamically varying the density threshold between each of multiple iterations of refining local placement.

12. The data processing system of claim 7, wherein determining whether placement of the plurality of modules has converged includes determining whether placement of the plurality of modules has converged to a point of relative stasis.

13. A program product, comprising:
a computer-readable storage device; and
program code stored within the computer-readable storage device, wherein the program code, when executed by a processor, causes a data processing to perform:
after a global placement phase of physical design of an integrated circuit, a data processing system iteratively performing intermediate placement by:
during each iteration of intermediate placement, iteratively refining local placement of a plurality of modules comprising the integrated circuit within a die area based on density of the plurality of modules until a module density threshold is satisfied;
during each iteration of intermediate placement, separately iteratively refining local wirelength for the plurality of modules in individual subareas among a plurality of subareas of the die area until a wirelength threshold is satisfied;
determining whether placement of the plurality of modules has converged;
in response to determining that placement of the plurality of modules has not converged, continuing the intermediate placement by performing said refining local placement and said refining local wirelength in another iteration of intermediate placement;

in response to determining that placement of the plurality of modules has converged, ending said iteratively performing intermediate placement; and after performing intermediate placement, performing detailed placement of modules in the plurality of subareas to obtain a placed physical design.

14. The program product of claim 13, wherein the program code causes the data processing system, in each iteration of intermediate placement, to perform refining local placement prior to separately refining local wirelength.

15. The program product of claim 13, wherein the program code causes the data processing system, in each iteration of intermediate placement, to perform refining local placement after separately refining local wirelength.

16. The program product of claim 13, wherein the density threshold comprises a predetermined value of an average density of a predetermined percentage of densest subareas of the die area.

17. The program product of claim 16, wherein the program code further causes the data processing system to perform dynamically varying the density threshold between each of multiple iterations of refining local placement.

18. The program product of claim 13, wherein determining whether placement of the plurality of modules has converged includes determining whether placement of the plurality of modules has converged to a point of relative stasis.

* * * * *